United States Patent
Kirn

(10) Patent No.: US 7,368,984 B2
(45) Date of Patent: May 6, 2008

(54) SWITCHING CLASS A-B AMPLIFIER

(75) Inventor: Larry Kirn, East Lansing, MI (US)

(73) Assignee: JM Electronic Ltd. LLC, Wilmington, DE (US)

( * ) Notice: Subject to any disclaimer, the term of this patent is extended or adjusted under 35 U.S.C. 154(b) by 131 days.

(21) Appl. No.: 11/114,628

(22) Filed: Apr. 26, 2005

(65) Prior Publication Data

US 2005/0237108 A1    Oct. 27, 2005

Related U.S. Application Data

(60) Provisional application No. 60/565,746, filed on Apr. 27, 2004.

(51) Int. Cl.
*H03F 3/38* (2006.01)

(52) U.S. Cl. .......................................................... 330/10
(58) Field of Classification Search .................. 330/10, 330/251
See application file for complete search history.

(56) References Cited

U.S. PATENT DOCUMENTS

| 4,933,645 | A  | * | 6/1990 | Kasai    | 330/255 |
| 6,563,376 | B2 | * | 5/2003 | Fujisawa | 330/10  |
| 6,628,221 | B2 | * | 9/2003 | Jin      | 341/152 |
| 7,061,192 | B2 | * | 6/2006 | Ito      | 315/371 |
| 7,068,096 | B2 | * | 6/2006 | Chu      | 330/10  |
| 2007/0124620 | A1 | * | 5/2007 | Miyazaki | 713/323 |

* cited by examiner

*Primary Examiner*—Steven J. Mottola
(74) *Attorney, Agent, or Firm*—Dorsey & Whitney LLP

(57) ABSTRACT

A circuit configuration and a method enables less-expensive bipolar switching devices to be employed in high-accuracy class D amplifiers. A constant-bias current is provided between the switching devices of a class D amplifier, and, through feedback or appropriate alternative implementation, the output levels of the class D amplifier achieve deterministic voltage levels regardless of current.

5 Claims, 1 Drawing Sheet

SWITCHING CLASS A-B AMPLIFIER

REFERENCE TO RELATED APPLICATION

This application claims priority to U.S. Provisional Patent Application Ser. No. 60/565,746, filed Apr. 27, 2004, the entire content of which is incorporated herein by reference.

FIELD OF THE INVENTION

This invention relates generally to electronic amplifiers and, in particular, to a circuit configuration and a method whereby less-expensive bipolar switching devices may be employed in high-accuracy class D amplifiers.

BACKGROUND OF THE INVENTION

Class A-B amplifiers ensure accurate amplification through the balance of non-saturated sink and source (push-pull) output stage sections which each provide current of a single polarity through both polarities of the output.

Class D amplifiers yield higher efficiency than class A-B amplifiers, through use of saturated mutually-exclusive sink and source switching devices. Being reliant on such devices, however, this class of amplifier enjoys no balancing mechanism. In that current in the output stage of a class D amplifier is not always in phase with the voltage, bulk devices which can conduct current in two directions, such as MOSFETs, are thus used to ensure that higher-potential devices may sink current, and that lower-potential devices may source current. MOSFETs, however, are more expensive than their bipolar counterparts, which conduct current only in a single direction.

The need exists for a circuit configuration and a method whereby less-expensive bipolar switching devices may be employed in high-accuracy class D amplifiers.

SUMMARY OF THE INVENTION

The present invention broadly resides a circuit configuration and a method whereby less-expensive bipolar switching devices may be employed in high-accuracy class D amplifiers.

In the preferred embodiment, a constant-bias current is provided between the switching devices of a class D amplifier, and, through feedback or appropriate alternative implementation, the output levels of the class D amplifier achieve deterministic voltage levels regardless of current.

DETAILED DESCRIPTION OF THE INVENTION

Figure 1:
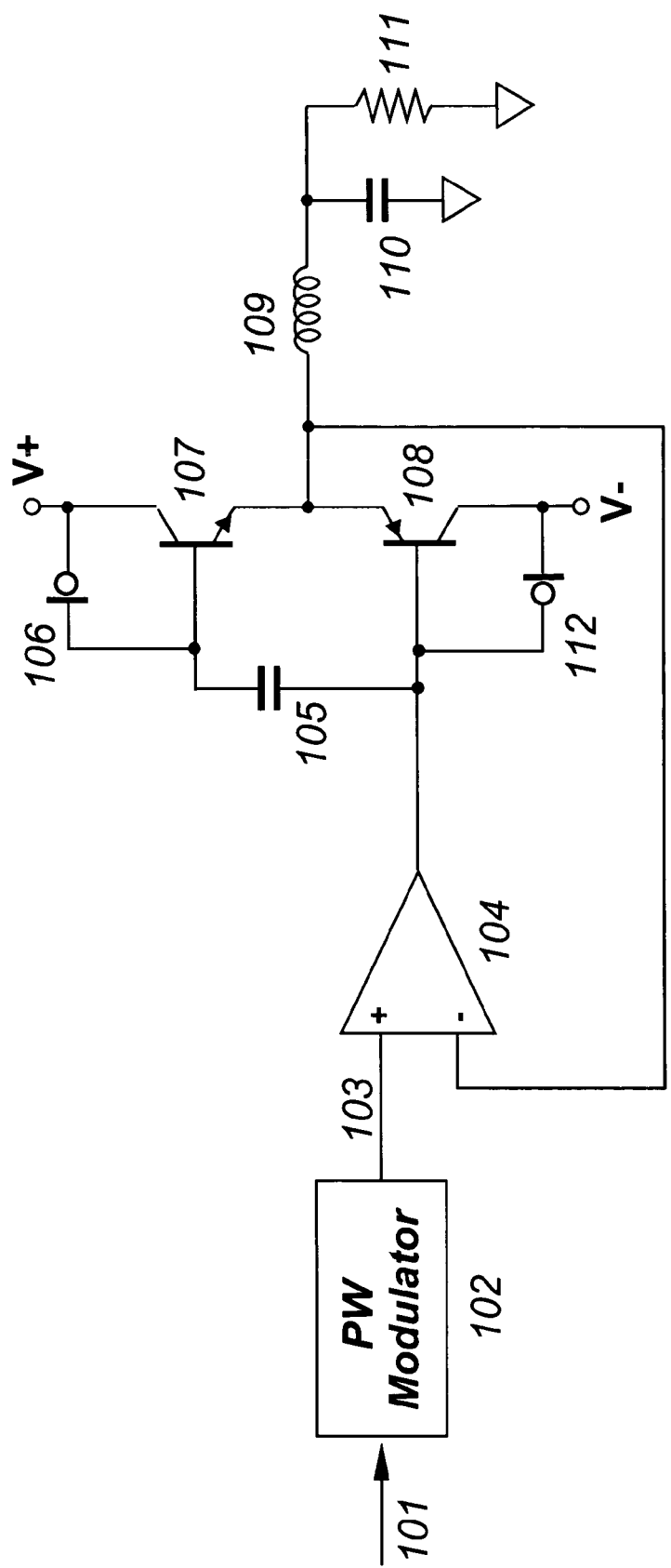
FIG. 1 shows a schematic diagram of a preferred embodiment of the present invention.

Referring now to FIG. 1, pulsewidth modulator 102 receives incoming data stream 101 as input, and produces digital pulsewidth stream 103 as output. Pulsewidth stream 103 is constrained to two invariant output levels, as is known in the art.

Error amplifier 104 receives pulsewidth stream 103 as a non-inverting input, and outputs a voltage to transistor 108 at its base input. The output of error amplifier 104 is similar in nature to pulsewidth stream 103, alternating between two narrowly-constrained voltage ranges.

Constant current source 106 provides a controlled current through transistor 107, while constant current source 112 provides a controlled current through transistor 108. The net effect is that a constant current flows through both transistors 107 and 108 at all times, in addition to any load current in either device.

Capacitor 105 couples the AC component of error amplifier 104 output to transistor 107 at its base input, while not disturbing the DC operation of constant current source 106. Transistor 107 receives positive supply voltage V+ at its collector and provides output at its emitter. Transistor 108 receives negative supply voltage V− at its collector and provides output at its emitter. In that the emitters of transistors 107 and 108 are connected, transistor 107 can be seen to be minimally sourcing a small current against transistor 108 at all times, and transistor 108 can be seen to be minimally sinking a small current against transistor 107 at all times.

Inductor 109, in conjunction with capacitor 110, filters high-frequency switching noise from the output signal of the emitters of transistors 107 and 108, and directly powers load 111. Note that the connected emitters directly drive the inverting input of error amplifier 104 as well. This ensures that the outputs of said transistors 107 and 108 will exactly replicate the invariant voltage levels of pulsewidth stream 103 output by pulsewidth modulator 102.

The preceding circuit description contains fundamental elements of both Class AB amplification, in the form of constant output stage bias current, and Class D amplification, in the form of switching operation. That is, if output current sourcing is predominant, a small sink current is always present; and if current sinking is predominant, a small source current is always present. This balance of the two (push-pull) output stage sections ensures that output transitions through zero always occur in a controlled fashion. This balance of two output stage sections yields another less-obvious benefit. Namely, in that current source and sink sections are always balanced against one another, each output stage section need only produce current in a single direction. That is, the current source section is never required to sink current, and the current sink section is never required to source current. This characteristic is extremely important for operation points where output current is not in phase with output voltage.

The switching nature of Class D amplifiers is well known in the art, but the output voltage and current in Class D amplifiers are often out of phase due to the common use of output filter inductors. Although early Class D amplifiers suffered high distortion by ignoring this fact, high-quality Class D amplifiers now almost universally employ switching elements with bidirectional current control, such as MOSFETs, to make current direction transparent to the pulsewidth modulation.

The circuit description of FIG. 1 essentially depicts a Class D modulator coupled to a Class AB output stage. The use of pulsewidth modulation in the present invention brings acceptance of digital input data and improved efficiency. The use of constant output bias current allows use of inexpensive transistors with unipolar current control. Note that output voltage and current in a Class D amplifier are out of phase approximately 50 percent of the time. Resultantly, the theoretical efficiency of the present invention is found to be approximately between that of a Class AB amplifier and a Class D amplifier.

Although bipolar transistors are shown herein, operation with alternative control elements is anticipated. The present invention finds utility in both bridged and single-ended applications.

I claim:

1. An electronic amplifier, comprising:
   a class AB output stage;
   a class D modulator coupled to the class AB output stage; and
   an error amplifier driving the class AB output stage, the error amplifier having as inputs the output of the modulator and the output of the output stage.

2. The amplifier of claim 1, wherein the Class D modulator includes a pulsewidth modulator operative to convert an incoming data stream into a digital pulsewidth stream.

3. The amplifier of claim 1, wherein the class AB output stage uses bipolar transistors.

4. The amplifier of claim 1, wherein a constant bias current is provided between the bipolar transistors.

5. The amplifier of claim 1, wherein the feedback to the error amplifier is used to achieve deterministic output voltage levels regardless of current.

* * * * *